(12) United States Patent
Schaefers et al.

(10) Patent No.: US 11,933,872 B2
(45) Date of Patent: Mar. 19, 2024

(54) TEST BODY FOR ANALYZING AND MONITORING THE IMAGE QUALITY OF MR TOMOGRAPHS

(71) Applicant: MRI-STaR—Magnetic Resonance Institute for Safety, Technology and Research GmbH, Bottrop (DE)

(72) Inventors: Gregor Schaefers, Bottrop (DE); Tobias Spronk, Haltern am See (DE)

(73) Assignee: MRI-STaR—Magnetic Resonance Institute for Safety, Technology and Research GmbH, Bottrop (DE)

(*) Notice: Subject to any disclaimer, the term of this patent is extended or adjusted under 35 U.S.C. 154(b) by 27 days.

(21) Appl. No.: 17/610,194

(22) PCT Filed: Feb. 25, 2020

(86) PCT No.: PCT/EP2020/054932
§ 371 (c)(1),
(2) Date: May 30, 2022

(87) PCT Pub. No.: WO2020/229003
PCT Pub. Date: Nov. 19, 2020

(65) Prior Publication Data
US 2022/0365160 A1     Nov. 17, 2022

(30) Foreign Application Priority Data
May 10, 2019   (DE) .................... 10 2019 112 313.5

(51) Int. Cl.
*G01R 33/58*     (2006.01)

(52) U.S. Cl.
CPC .................... *G01R 33/58* (2013.01)

(58) Field of Classification Search
None
See application file for complete search history.

(56) References Cited

U.S. PATENT DOCUMENTS

| | | | | |
|---|---|---|---|---|
| 4,613,819 A | * | 9/1986 | Chui | G01R 33/58 |
| | | | | 324/318 |
| 4,749,948 A | * | 6/1988 | Duby | G01R 33/24 |
| | | | | 324/308 |

(Continued)

FOREIGN PATENT DOCUMENTS

| | | | |
|---|---|---|---|
| CN | 203720341 U | * | 7/2014 |
| CN | 107544041 | | 1/2018 |

(Continued)

OTHER PUBLICATIONS

Internationaler Recherchenbericht und Schriftlicher Bescheid [International Search Report and the Written Opinion] dated Jul. 16, 2020 From the International Searching Authority Re. Application No. PCT/EP2020/054932. (11 Pages).

*Primary Examiner* — Rodney E Fuller

(57) ABSTRACT

A phantom for calibration and quality assurance of an MR tomograph that comprises a phantom body with measuring aids and an intermediate bottom in at least four planes. The first plane contains only measuring fluid. The second plane contains wedge-shaped elements. The third plane contains marks of known distance. The fourth plane contains comb-shaped elements. The measuring aids of the second plane are arranged on one side of the intermediate bottom and those of the fourth plane on the other side. The marks of the third plane are arranged in the intermediate bottom. This arrangement enables reliable calibration of the MR tomograph in a few steps with only this phantom.

11 Claims, 5 Drawing Sheets

(56) References Cited

U.S. PATENT DOCUMENTS

| | | | | |
|---|---|---|---|---|
| 4,777,442 A | * | 10/1988 | Rosenthal | G01R 33/58 |
| | | | | 324/309 |
| 5,312,755 A | * | 5/1994 | Madsen | G01R 33/58 |
| | | | | 324/307 |
| 2008/0269594 A1 | * | 10/2008 | Paul | A61B 6/037 |
| | | | | 324/318 |
| 2009/0190723 A1 | * | 7/2009 | Jang | A61B 6/583 |
| | | | | 378/207 |
| 2011/0229055 A1 | * | 9/2011 | Clarke | A61B 6/583 |
| | | | | 382/287 |
| 2015/0084625 A1 | | 3/2015 | Yin et al. | |
| 2016/0282439 A1 | | 9/2016 | Choe et al. | |
| 2019/0113591 A1 | * | 4/2019 | Barberi | G01R 33/58 |
| 2019/0117317 A1 | * | 4/2019 | Abayazid | A61B 5/7267 |

FOREIGN PATENT DOCUMENTS

| | | |
|---|---|---|
| GB | 2155187 | 9/1985 |
| KR | 10-2008-0111737 | 12/2008 |

* cited by examiner

TEST BODY FOR ANALYZING AND MONITORING THE IMAGE QUALITY OF MR TOMOGRAPHS

RELATED APPLICATIONS

This application is a National Phase of PCT Patent Application No. PCT/EP2020/054932 having International filing date of Feb. 25, 2020, which claims the benefit of priority of German Patent Application No. 10 2019 112 313.5 filed on May 10, 2019. The contents of the above applications are all incorporated by reference as if fully set forth herein in their entirety.

FIELD AND BACKGROUND OF THE INVENTION

The invention relates to a novel test body, a so-called phantom, for calibration, image quality analysis and/or quality assurance in a magnetic resonance tomograph.

Magnetic resonance imaging (MRI for short hereinbelow), frequently also referred to as nuclear spin tomography, is an imaging method in medical diagnostics. It is based on the physical effect of nuclear magnetic resonance and permits three-dimensional visualization of body structures including tissues. The three-dimensional visualization is thereby obtained by combining a plurality of virtual sectional images of the body region to be examined.

In simple terms, in order to make visible different tissues and thus in order to visualize different body structures and organs, MRI ultimately makes use of the fact that certain atomic nuclei, in particular those of hydrogen atoms, are magnetic and also magnetizable owing to their inherent rotation (the so-called nuclear spin). By application of a high-frequency alternating field, these atomic nuclei, once magnetization has taken place, can be "tilted" out of their static state of equilibrium. These tilted atomic nuclei then induce a measurable current. Once the high-frequency alternating field is removed, the tilted atomic nuclei tend to return to their static state of equilibrium, which is referred to as relaxation. The contrast required for the visualization of different structures and tissues is based on the fact that different tissues have different relaxation times.

Magnetic resonance tomographs (MR tomographs for short hereinbelow) for performing an MRI are accordingly highly complex instruments. The images generated thereby must depict the actual anatomical conditions of the examined object as precisely as possible. In particular, artifacts in the data generation and imaging that occur due to technical reasons must be avoided at all costs, since they may lead to misdiagnoses and consequently to mistreatment.

In order to minimize the risk of such artifacts that occur due to technical reasons, MR tomographs must regularly be maintained and optionally calibrated. The most important standard for such a calibration method at present is standard IEC 62464-1 for determination of essential image quality parameters.

The six parameters to be determined according to this standard include signal-to-noise ratio, uniformity, layer thickness, ghosting artifacts, geometric distortion, and spatial resolution.

In order to test and optionally calibrate these parameters, test bodies, so-called phantoms, are introduced into the MR tomographs. Corresponding phantoms are known in the prior art.

Known phantoms generally comprise a hollow cylindrical base body which is filled with fluid and has a number of measuring aids.

Known measuring aids include
measuring fluids defined in respect of the parameters $T_1$ (longitudinal relaxation time), $T_2$ (transverse relaxation time) and proton density, for determining or calibrating in particular the parameters signal-to-noise ratio, uniformity and ghosting artifacts;
wedge-shaped elements for determining or calibrating in particular the parameter layer thickness;
marks of known distance from one another for determining or calibrating in particular the parameter geometric distortion;
comb-shaped elements for determining or calibrating in particular the parameter spatial resolution.

It is a disadvantage of the prior art that multiple, namely up to six, different phantoms are generally necessary for fully determining or calibrating the image quality parameters required by the standard. However, as small a number of phantoms as possible would be desirable for several reasons.

Firstly, for reasons of the cost saving associated with the procurement and storage of ideally only a single phantom in contrast to a plurality of phantoms.

Secondly, for reasons of efficiency, because each step which can be saved in the calibration reduces the required working time.

Not least, of course, for reasons of reliability, because each step which can be saved in the calibration also helps to reduce the error rate. A determination and calibration of the essential image quality parameters that is simple to carry out thus results in fewer errors in this process and thus in more accurate imaging, diagnosis, and ultimately better treatment.

With the provision of a phantom which is simpler to use and can be used in a time-saving manner in the determination and/or calibration of the essential image quality parameters, it is thus possible to save costs and to reduce operating errors and working times and thus to increase the operating time of the MR tomograph. Ultimately, the reliability of the MR tomograph is thus likewise increased, as are its possible usage times.

It is also a disadvantage of the prior art that known phantoms are composed of a plurality of individual parts, the assembly and calibration of which is complex and thus both cost- and time-intensive as well as susceptible to errors during assembly and during production.

Known phantoms which allow more than one parameter to be determined and/or calibrated simultaneously thus generally provide the corresponding measuring aids in module form, wherein each measuring aid is arranged in its own module. Such a known phantom accordingly comprises a specific number of modules, each of which must be produced individually, which is time-consuming and labor-intensive and thus cost-intensive and susceptible to errors.

Not least, it is an essential requirement for the success of the determination and/or calibration of the essential image quality parameters that the phantom is placed correctly oriented in the MR tomograph. Known phantoms accordingly provide adapters, which can generally be used universally for different systems. However, such universal adapters frequently have the disadvantage that they are unable to provide the precision that is ultimately necessary. This is the compromise which such a solution must accept in respect of its universality.

SUMMARY OF THE INVENTION

Accordingly, it is an object of the invention to provide a phantom which permits the required determination and/or calibration of the essential image parameters in a single phantom in as few steps as possible, which are simple to carry out.

It is an additional object of the invention to provide a phantom which comprises as small a number of individual elements as possible and is thus inexpensive and, even in production, is less susceptible to errors on assembly.

It is a further object of the invention to provide a measuring and evaluation method which is simple to use, permits optimum determination and/or calibration of the essential image quality parameters and is error-proof.

This object is achieved by a device according to the invention having the features of claim 1. Advantageous embodiments are the subject-matter of the dependent claims. It should be pointed out that the features mentioned individually in the claims can also be combined with one another in any desired and technologically expedient manner and thus demonstrate further embodiments of the invention.

A phantom according to the invention comprises a phantom body with measuring aids arranged therein. The phantom body is preferably manufactured from a material which permits rapid visual detection of material damage both to the body and to the measuring aids. A suitable material is, for example, acrylic glass. The phantom body preferably comprises a hollow cylindrical base element at the upper and lower end of which there are provided a head plate and a bottom plate, respectively, which seal the base element at least in a fluid-tight manner.

The size of the phantom preferably corresponds to the respective normative requirements, for example IEC 62464-1, wherein in principle a small weight with at the same time high stability is to be achieved. The dimensions of the phantom body are of course to be chosen at least such that there is space therein for the measuring aids provided.

The measuring aids are to be positioned in the phantom body such that the phantom has to be introduced into the MR tomograph only once for each axis to be measured. This is advantageous since introducing the phantom body only once for each axis to be measured makes it possible to save time and to minimize sources of error. The duration of the determination and/or calibration of the essential image quality parameters can thus be reduced almost to only the scanning time.

The various measuring aids are to this end arranged in individual planes, wherein the planes are preferably arranged inside the phantom body parallel to the head and bottom plate.

The term "plane" is to be understood in this context as being a longitudinal portion of the phantom body, wherein the phantom body itself is not understood as being part of the plane and each plane comprises substantially only one measuring aid.

The phantom body is filled with an aqueous salt solution as the measuring fluid, which solution, owing to its specific composition, simulates the electrical properties of muscle tissue. A preferred salt solution comprises in particular copper sulfate and sodium chloride. The solution can be designed for different field strengths, for example for MR tomographs with a field strength of 1.5 T.

For introducing, discharging, or exchanging the measuring fluid, corresponding feed and/or discharge lines can be provided on the phantom body and in particular on the head and/or bottom plate thereof. Correspondingly suitable valve elements can be provided on these feed and/or discharge lines.

A phantom according to the invention further comprises an intermediate bottom having an upper and a lower side, on or in which all the fixed measuring aids, that is to say all those which are not a measuring fluid, are arranged. These are wedge-shaped elements for the determination or calibration in particular of the parameter layer thickness, marks of known distance from one another for the determination or calibration in particular of the parameter geometric distortion, and comb-shaped elements for the determination or calibration in particular of the parameter spatial resolution.

According to the invention, the wedge-shaped elements are provided on one side of the intermediate bottom and the comb-shaped elements are provided on the other side of the intermediate bottom. Marks of known distance from one another, in particular in the form of holes made perpendicularly to the plane of the intermediate bottom, are provided in the intermediate bottom itself.

The intermediate bottom is arranged inside the phantom body preferably parallel to the head and bottom plates. In particular, the intermediate bottom with the measuring aids is additionally so arranged inside the phantom body that there is only measuring fluid and no fixed measuring aids at least in one plane of the phantom body.

In accordance with the above definition of a plane, a phantom according to the invention accordingly comprises a phantom body having at least four planes.

A first plane comprises the defined measuring fluid, wherein in particular the parameters $T_1$ (longitudinal relaxation time), $T_2$ (transverse relaxation time) and proton density are known. The measuring fluid is preferably a salt solution comprising copper sulfate and sodium chloride, which must be adapted to the particular field strength of the test environment. This first plane serves especially for the determination or calibration of the signal-to-noise ratio, the uniformity, and ghosting artifacts.

A second plane comprises wedge-shaped elements for the determination or calibration of the layer thickness. The wedge-shaped elements are preferably arranged in pairs, wherein the individual wedges of a pair are in each case arranged parallel to one another and the tip of one wedge points towards the base of the other wedge and vice versa. If two or more pairs of wedge-shaped elements are provided, at least two of these pairs are provided in a mutually perpendicular arrangement.

A third plane comprises marks of known distance from one another for the determination or calibration of the geometric distortion. The marks are preferably provided as bores, in particular as bores in or through the intermediate bottom.

A fourth plane comprises at least two comb-shaped elements for the determination or calibration of the spatial resolution. A comb-shaped element comprises substantially a base with fins standing perpendicularly thereon and oriented parallel to one another.

The at least two comb-shaped elements are oriented relative to one another in such a way that the fins of the two elements are perpendicular to one another.

According to the invention, the measuring aids of the second, third and fourth plane, as described hereinbefore, are arranged on or in the intermediate bottom or are connected thereto. The third plane thus corresponds substantially to the intermediate bottom with the marks of known distance from one another.

All the planes that comprise a fixed measuring aid are of course also filled by the measuring fluid.

In a particularly preferred embodiment, the phantom comprises exactly four planes, wherein the first plane comprises as the measuring aid only the measuring fluid of known density, preferably a salt solution comprising copper sulfate and sodium chloride, for the determination or calibration of the signal-to-noise ratio, the uniformity, and ghosting artifacts.

The second plane comprises, in addition to the measuring fluid, only wedge-shaped elements for the determination or calibration of the layer thickness. The wedge-shaped elements are preferably arranged in pairs, wherein the individual wedges of a pair are in each case arranged parallel to one another and the tip of one wedge points towards the base of the other wedge and vice versa. Preferably, two pairs of wedge-shaped elements which are arranged perpendicularly to one another are provided.

The third plane comprises, in addition to the measuring fluid, only the intermediate bottom with marks of known distance from one another for the determination or calibration of the geometric distortion. The marks are provided as bores through the intermediate bottom.

A fourth plane comprises, in addition to the measuring fluid, only comb-shaped elements for the determination or calibration of the spatial resolution. A comb-shaped element comprises substantially a base having fins standing perpendicularly thereon and oriented parallel to one another. Preferably, two comb-shaped elements are oriented relative to one another in such a way that the fins of the two elements are perpendicular to one another.

In this embodiment too, all the planes that comprise a fixed measuring aid are of course also filled by the measuring fluid.

Not least, the phantom according to the invention preferably comprises a holder which is to be individually adapted to the MR tomograph in which the phantom is to be used. Such an individually adapted holder is advantageous since it saves the user time-consuming and error-prone positioning and alignment of the phantom. Instead, an individually adapted holder not only ensures rapid and error-free positioning and alignment of the phantom, but also ensures the reproducibility of the measurement.

BRIEF DESCRIPTION OF THE SEVERAL VIEWS OF THE DRAWINGS

The invention and the technical context will be explained in greater detail hereinbelow with reference to the figures. It should be pointed out that the figures show a particularly preferred embodiment variant of the invention. However, the invention is not limited to the embodiment variant shown. In particular, the invention comprises, where technically expedient, any desired combinations of the technical features which are mentioned in the claims or described in the description as being relevant to the invention.

In the figures.

DESCRIPTION OF SPECIFIC EMBODIMENTS OF THE INVENTION

Figure 1:
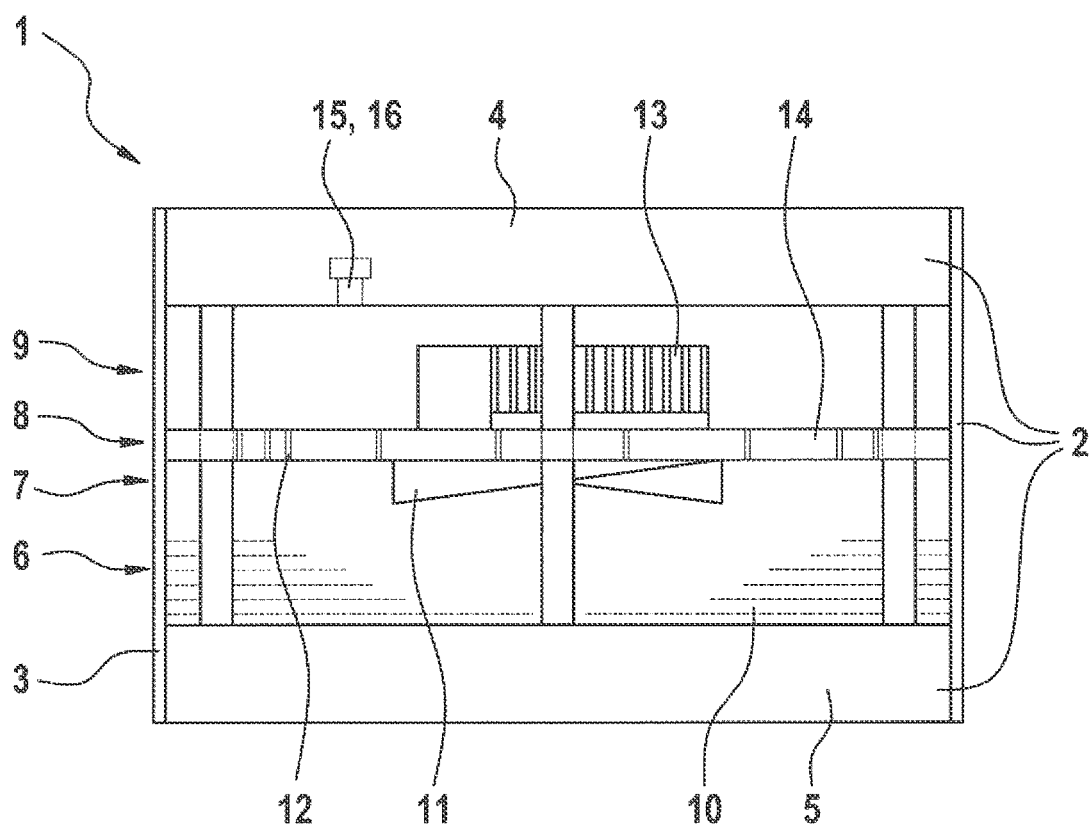
FIG. 1 is a side view of a phantom according to the invention.

FIG. 1 shows a phantom 1 according to the invention having a phantom body 2, measuring aids 10, 11, 12, 13 and an intermediate bottom 14. The phantom body 2 comprises a hollow cylindrical base body 3 and a head plate 4 and a bottom plate 5, which are arranged at the two ends of the hollow cylindrical base body 3. The head plate 4 and the bottom plate 5 are arranged parallel to one another and perpendicularly to the longitudinal center axis of the hollow cylindrical base body 3.

The head plate 4 and the bottom plate 5 seal the hollow cylindrical base body 3 at least in a fluid-tight manner. At least the hollow cylindrical base body 3 is preferably manufactured from an optically transparent material, for example from acrylic glass, so that damage to the phantom 1 is visually perceivable.

The measuring aids 10, 11, 12, 13 and the intermediate bottom 14 are arranged inside the phantom body 2. The measuring fluid 10 fills the phantom body 2 almost completely. The other measuring aids 11, 12, 13 are arranged on or in the intermediate bottom 14.

Overall, the measuring aids are arranged in four planes 6, 7, 8, 9 which are arranged in succession and in parallel along the center longitudinal axis of the phantom body. Of course, the measuring fluid 10 penetrates all the planes 6, 7, 8, 9.

The first plane 6 comprises as the measuring aid only the measuring fluid 10. The second plane 7 comprises as the measuring aid wedge-shaped elements 11. The third plane 8 comprises as the measuring aid marks 12, which are preferably arranged in or on the intermediate bottom 14. The fourth plane 9 comprises as the measuring aid comb-like elements 13. According to the invention, the wedge-shaped elements 11, the marks 12 and the comb-like elements 13 are arranged on or in the intermediate bottom 14.

In order to allow the measuring fluid 10 to be exchanged, openings 15 are optionally provided in the head plate 4 and/or in the bottom plate 5, through which openings the measuring fluid 10 can be fed in or discharged. Optional valve elements 16 can increase the tightness of the phantom 1 at these points.

Figure 2:
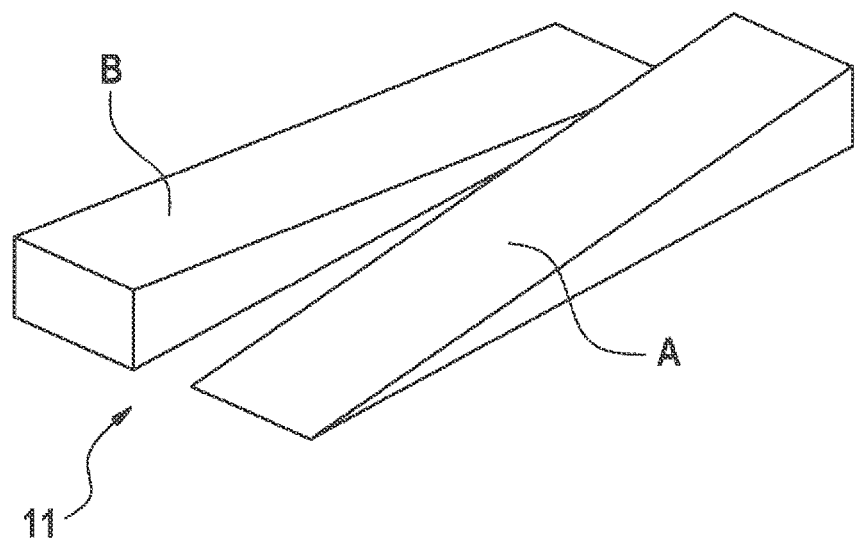
FIG. 2 is a perspective view of the wedge-shaped measuring elements and, therebeneath, a schematic top view of the arrangement of these elements in the plane.
Figure 2:
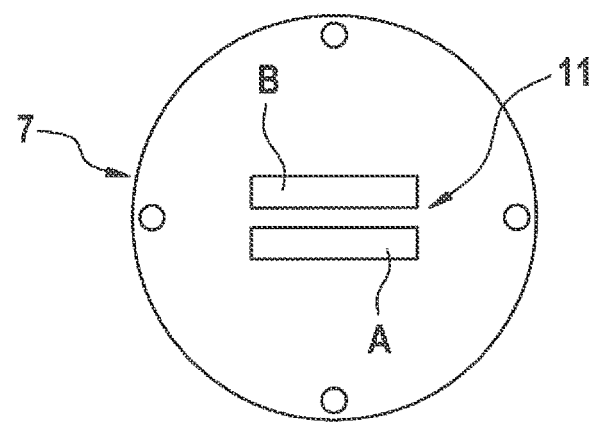

FIG. 2 shows in detail the wedge-shaped elements 11 of the second plane 7. Preferably, the wedge-shaped elements 11 are of the same size and are arranged in pairs comprising a first wedge-shaped element 11A and a second wedge-shaped element 11B. The individual wedges 11A, 11B of a pair 11 are in each case arranged parallel to one another, wherein the tip of one wedge 11A points towards the base of the other wedge 11B and vice versa. In particular, the tip of one wedge 11A ends at the base of the other wedge 11B and vice versa. If two pairs of wedge-shaped elements 11 are provided, they are preferably arranged perpendicularly to one another. The wedge-shaped elements 11 serve for the determination or calibration of the layer thickness.

Figure 3:
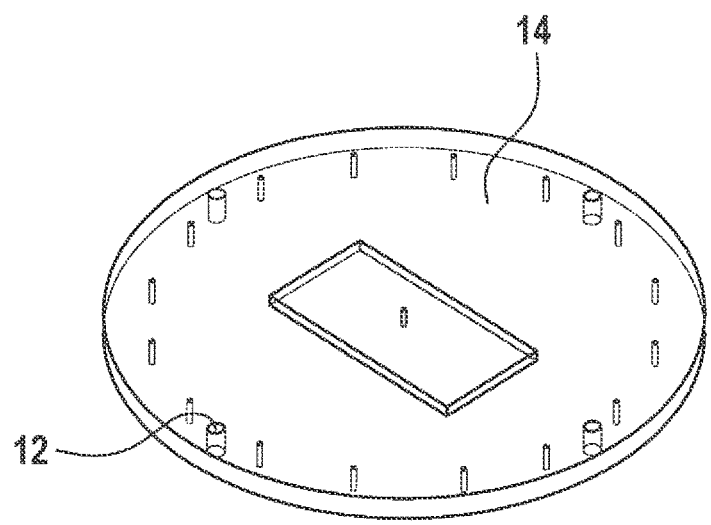
FIG. 3 is a perspective view of the third plane with distance marks and, therebeneath, a schematic top view of the arrangement of the marks in the plane.
Figure 3:
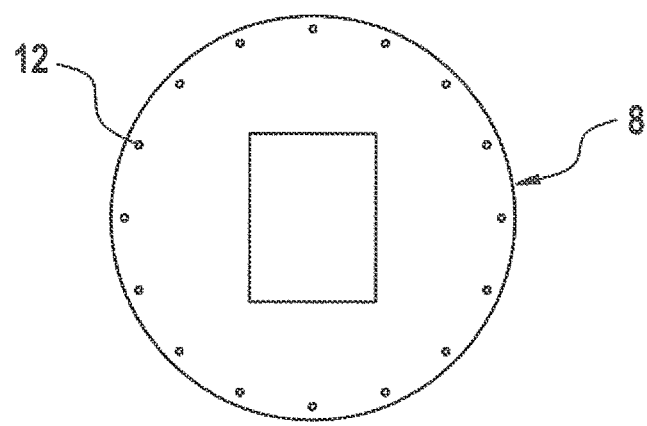

FIG. 3 shows in detail the third plane 8 having the intermediate bottom 4 and the marks 12 arranged thereon. Preferably, the marks 12 are provided as perpendicular bores through the intermediate bottom 14. The marks 14 of known distance from one another serve for the determination or calibration of the geometric distortion. The distribution pattern of these marks 12 shown by way of example in FIG. 3 can be adapted to the normative requirements that apply in a particular case.

Figure 4:
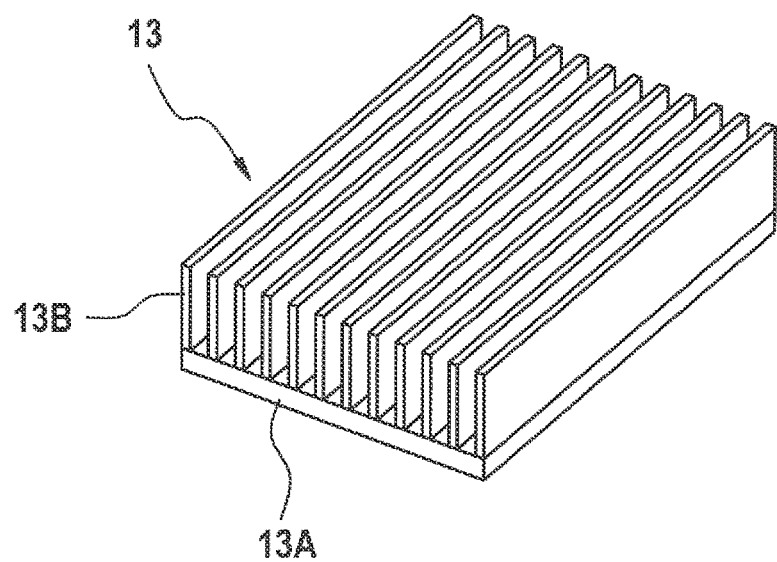
FIG. 4 is a perspective view of the fourth plane with comb-shaped measuring elements and, therebeneath, a schematic top view of the arrangement of these elements in the plane.
Figure 4:
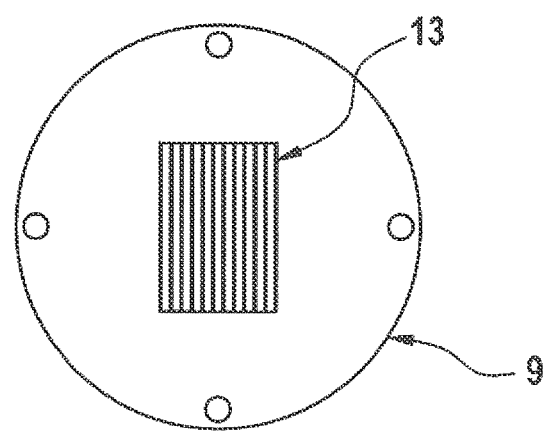

FIG. 4 shows in detail the comb-shaped elements 13 of the fourth plane 9 in detail and, in a plan view, a preferred arrangement. The comb-shaped elements 13 comprise a base 13A, and fins 13B arranged perpendicularly on the base and oriented parallel to one another. The comb-shaped elements 13 serve for the determination or calibration of the spatial resolution. If two comb-shaped elements 13 are provided in the fourth plane 9, they are oriented relative to one another in such a way that the fins 13B of the two elements 13 are arranged perpendicularly to one another.

Figure 5:
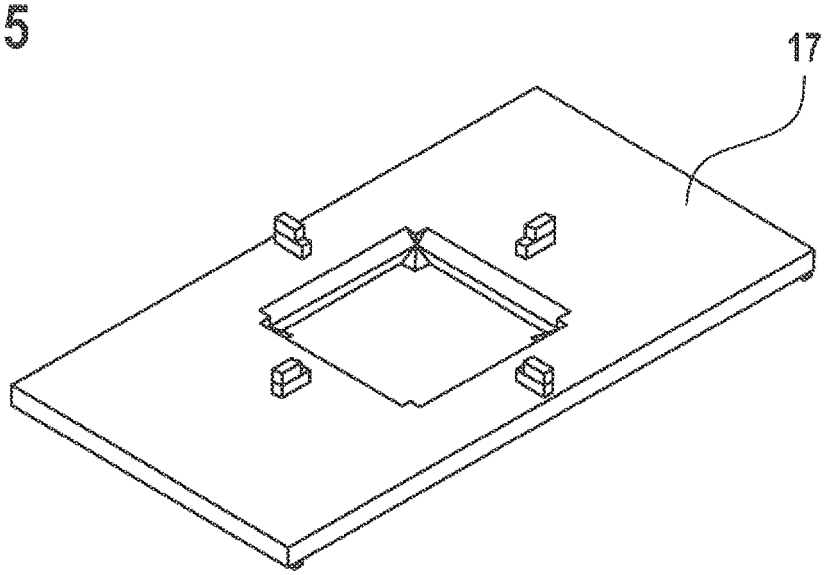
FIG. 5 is a perspective view of the holder and, therebeneath, the arrangement of the phantom with the holder in the tube of an MR tomograph.
Figure 5:
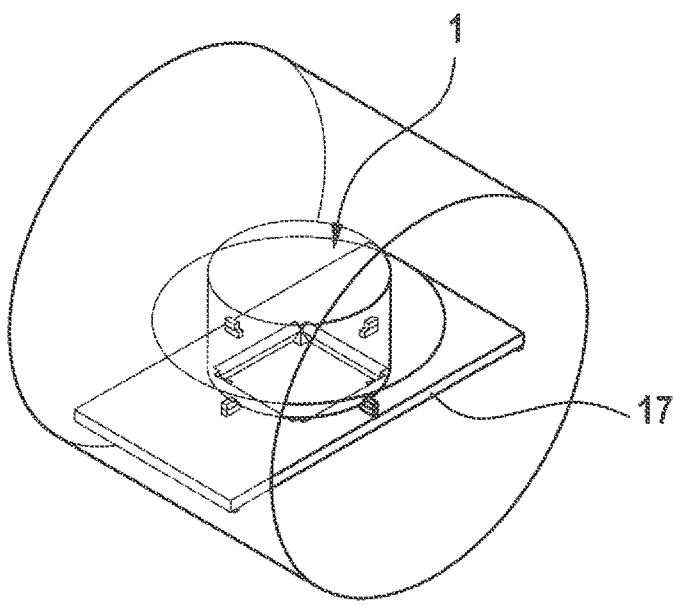

FIG. 5 shows a schematic illustration of the holder 17 for receiving the phantom 1. As well as ensuring that the phantom 1 is held securely, the holder 17 also ensures the reproducibility of the maintenance work that is to be carried out. The accuracy of fit of the holder 17 ensures in particular that, for each new maintenance operation that is to be carried out, namely a calibration or a determination of the essential image quality parameters, the phantom 1 will be arranged in the MR tomograph in exactly the same position as for the last maintenance operation.

| List of reference numerals | |
|---|---|
| 1 | phantom |
| 2 | phantom body |
| 3 | base element |
| 4 | head plate |
| 5 | bottom plate |
| 6 | first plane |
| 7 | second plane |
| 8 | third plane |
| 9 | fourth plane |
| 10 | measuring fluid |
| 11 | wedge-shaped elements (A, B individual wedges) |
| 12 | marks |
| 13 | comb-shaped elements (13A base, 13B fins) |
| 14 | intermediate bottom |
| 15 | feed or discharge line |
| 16 | valve element |
| 17 | holder |

What is claimed is:

1. A phantom for use in an MR tomograph, having:
a phantom body,
measuring aids, and
an intermediate bottom having an upper and a lower side;
wherein the measuring aids and the intermediate bottom are arranged in the phantom body in at least four planes,
wherein a first plane comprises as the measuring aid only the measuring fluid,
a second plane comprises as the measuring aid wedge-shaped elements, a third plane comprises as the measuring aid marks of known distance from one another, and a fourth plane comprises as the measuring aid comb-shaped elements;
wherein the measuring aids of the second plane are arranged on the one side of the intermediate bottom, the measuring aids of the fourth plane are arranged on the other side of the intermediate bottom, and the measuring aids of the third plane are arranged in the intermediate bottom.

2. The phantom according to claim 1, wherein the phantom body comprises a hollow cylindrical base element which is closed at the upper and lower end by at least a head plate and a bottom plate.

3. The phantom according to claim 2, wherein the intermediate bottom is arranged parallel to the head plate and the bottom plate.

4. The phantom according to claim 1, wherein the wedge-shaped elements of a second plane that are provided as measuring aids are arranged in pairs, wherein the individual wedges of a pair are in each case arranged parallel to one another and the tip of one wedge points towards the base of the other wedge and vice versa.

5. The phantom according to claim 1, wherein the marks of a third plane that are provided as measuring aids are provided as bores in the intermediate bottom.

6. The phantom according to claim 1, wherein the comb-shaped elements comprise a base with fins standing perpendicularly thereon and oriented parallel to one another, and at least two of the comb-shaped elements of a fourth plane that are provided as measuring aids are oriented relative to one another in such a way that the tins of the two comb-shaped elements are oriented perpendicularly to one another.

7. The phantom according to claim 1, wherein the measuring fluid comprises a salt solution comprising copper sulfate and sodium chloride.

8. The phantom according to claim 1, wherein the phantom body is manufactured substantially from acrylic glass.

9. The phantom according to claim 1, wherein teed and/or discharge lines for the measuring fluid are provided on the phantom body, in particular on the head and/or bottom plate.

10. The phantom according to claim 9, wherein valve elements are provided on these feed and/or discharge lines.

11. The phantom according to claim 1, wherein the phantom comprises a holder which is individually adapted to an MR tomograph.

* * * * *